United States Patent [19]
Kitajima et al.

[11] Patent Number: 5,824,200
[45] Date of Patent: Oct. 20, 1998

[54] GENERATION OF ELECTROLYTICALLY ACTIVE WATER AND WET PROCESS OF A SEMICONDUCTOR SUBSTRATE

[75] Inventors: Hiroshi Kitajima; Yoshimi Shiramizu, both of Tokyo, Japan

[73] Assignee: NEC Corporation, Tokyo, Japan

[21] Appl. No.: 832,199

[22] Filed: Apr. 8, 1997

Related U.S. Application Data

[63] Continuation of Ser. No. 405,780, Mar. 17, 1995, abandoned.

[30] Foreign Application Priority Data

Mar. 25, 1994 [JP] Japan ..................................... 6-056106

[51] Int. Cl.$^6$ ....................................................... C25B 9/00
[52] U.S. Cl. ............................................................. 204/265
[58] Field of Search ............................. 204/265; 205/464, 205/628, 687

[56] References Cited

U.S. PATENT DOCUMENTS

| | | | |
|---|---|---|---|
| 4,039,421 | 8/1977 | Mas | 214/266 |
| 4,324,635 | 4/1982 | Sweeney | 204/266 |
| 4,902,397 | 2/1990 | Kelham | 204/258 |
| 5,122,239 | 6/1992 | McElroy et al. | 204/265 |
| 5,242,564 | 9/1993 | Traini | 204/258 |
| 5,411,641 | 5/1995 | Trainham, III et al. | 204/265 |

FOREIGN PATENT DOCUMENTS 6-260480   9/1994   Japan .

OTHER PUBLICATIONS

G. Valensi et al., "Chlorine", Section 20.2, pp. 590–603.

*Primary Examiner*—Kathryn L. Gorgos
*Attorney, Agent, or Firm*—Young & Thompson

[57] ABSTRACT

There is provided a method of, and an apparatus for obtaining electrolytically activated water having stable characteristics comprising steps of bringing a gas containing at least one of chlorine, hydrogen chloride, hydrogen bromide and hydrogen iodide into contact with a liquid in an anode cell of an electrolytic cell or a liquid supplied thereto and/or bringing ammonia into contact with a liquid in a cathode cell of the electrolytic cell, or a liquid supplied thereto to dissolve the gas to thereby electrolyze this liquid. The resulting electrolytically activated water is optimal as the wet treating solution adapted for semiconductor substrate.

4 Claims, 7 Drawing Sheets

GENERATION OF ELECTROLYTICALLY ACTIVE WATER AND WET PROCESS OF A SEMICONDUCTOR SUBSTRATE

This application is a continuation of application Ser. No. 08/405,780, filed Mar. 17, 1995, now abandoned.

BACKGROUND OF THE INVENTION

The present invention relates to generation of electrolytically activated water and to various processes carried out under wet condition, i.e., wet treatment, such as cleaning, etching and rinsing of a semiconductor wafer which are conducted by utilizing the electrolytically activated water.

In the wet treatment of the semiconductor manufacturing process, it is a common practice to use a great amount of chemicals at a high concentration. For example, in the cleaning process whose main aim is to remove particles, a great amount of chemicals (ammonia-excess water) consisting of ammonium hydride (27%), aqueous hydrogen peroxide solution (30%) and water at a volume ratio of 1:1:5 is used. Further, in the cleaning process whose main aim is to remove metallic contamination, a great amount of chemicals which is mixture of hydrochloric acid (37%) and hydrogen peroxide water (30%) and water at a ratio of 1:1:6 is used. However, it is not desirable from environmental or ecological view point to use such chemicals, and in view of the costs of waste water treatment, it is urgently called for to reduce the chemicals. From that viewpoint, many attempts have been made for reduction of the chemicals in the wet process.

As one of such measures, it has been proposed to electrolyze water or an aqueous solution containing a trace of supporting electrolyte and to apply the resulting activated water to the cleaning process. One example of them is redox-type cleaning which is described in "Cleaning Design" (Kindai Henshusha, 1987, Spring issue, page 1, hereinafter referred to as publication 1). An electrolytic cell shown in the publication 1 is illustrated in FIG. 1. The basic structure of the electrolytic cell shown in FIG. 1 was developed by General Electric Inc. in the early period of 1970, in which a cation exchange resin (or cation exchange film) 1001 is sandwiched with a meshed anode 1002 made of platinum and a cathode 1003 made of platinum or carbon. An amount of pure water is supplied to the cathode and anode portions where, the interior is filled with water, since the anode 1002 and the cathode 1003 are meshed. In this state, a DC current is applied between both electrodes from a DC power supply 1006, so that water is electrolyzed due to the known reaction, and on the anode side, active anode water 1004 is generated while, on the cathode side, active cathode water 1005 is generated.

That is, because of the DC voltage applied between the electrodes, hydrogen ions 1007 migrate through the cation exchange film 1001, and current flows between both electrodes. As a result, on the anode side, the following oxidizing reaction proceeds depending on whether the electrolyzed solution is acidic or alkaline. Under acidic condition:

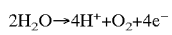

Under alkaline condition:

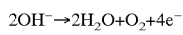

As obvious from the foregoing formulas, under the acidic condition, $H^+$ is increased, while, under the alkaline condition, $OH^-$ is consumed, but in either case, both rise of the acidity and generation of oxygen gas 1008 occur.

On the other hand, on the cathode side, likewise, the following reduction reactions each proceed depending on whether the electrolyzed solution is acid or alkaline. Under acidic condition:

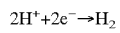

Under alkaline condition:

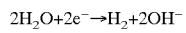

On the cathode side, oppositely to the anode side, under the anode condition, $H^+$ is consumed, and under the alkaline condition, $OH^-$ is increased, but in either case, both rise of the alkalinity and generation of the hydrogen gas 1009 occur.

That is, the electrolytic cell having a structure shown in FIG. 1 is suitable to obtain oxygen gas or hydrogen gas by electrolyzing water, but for the purpose of producing the electrolytically activated water applied to the semiconductor wet process, improved stabilization and repeatability of characteristic control have been called for.

In the wet process for semiconductors, the aptitude of the used chemicals usually depends largely on hydrogen ion concentration (pH) and oxidation-reduction potential. The apparatus of FIG. 1 allows a great amount of $H^+$ or $OH^-$ to be generated by electrolysis of water, but a seasonal change occurs to its characteristic by the time it is actually used in the wet process, since pH or oxidation-reduction potential is not stable enough. Such a problem is considered to stem from the fact that the activity of water arises only from the concentration of $H^+$ or $OH^-$.

The known apparatus of FIG. 1 is specially designed for electrolysis of pure water, but a method has also been proposed in which a typical double-layer electrolytic cell is used to obtain electrolytically activated water by electrolyzing water with a supporting electrolyte added to lower the resistance of water. For example, JPA Hei 5-105991 discloses a wet treatment method and apparatus using $H^+$ ion water and $OH^-$ ion water generated by electrolyzing water. According to this known technique, generation of the electrolytically activated water is achieved by supplying water with a substance for increasing the electrolytic efficiency added and applying DC high voltage between the immersed anode and cation.

FIG. 2 illustrates a structure of a wet process apparatus utilizing the double-layer electrolytic cell. The electrolytic cell 1101 is divided into two chambers by means of a porous diaphragm 1102, into each of which a rod electrode is inserted. When a DC voltage is applied from a DC power supply 1103 between both electrodes, then the positive side works as the anode 1104 and the negative side as the cathode 1105. In such an apparatus, chemicals comprising a combination of a trace of quaternary alkyl ammonium and cation other than halogen are added as the supporting electrolyte for electrolysis, then acid anode water is generated in the neighborhood of the anode, and alkaline cathode water is generated in the neighborhood of the cathode. The resulting anode water or cathode water is supplied to a water cell 1106 in which wet treatment of a semiconductor substrate 1107 is carried out.

Waste solution from the treated water cell 1106 is retained in a waste water storage cell, and a supernatant liquid is passed through a water cleaner 1108 and an ion exchanger 1109 for regeneration to be turned into pure water 1110. In FIG. 2, reference numeral 1111 denotes a system for adding electrolyte, 1112 a system for controlling pH. Signals of a pH sensor 1113 which is inserted within the treated water cell 1106 are input to the pH control system so that the amount of added electrolyte is controlled.

The foregoing JPA Hei 5-105991 shows the effect of removing the metallic contamination sticking to the semiconductor substrate by applying the resulting anode water for cleaning. Further, it is also described that colloidal silica remaining on the semiconductor substrate when the silicon dioxide film lying on the semiconductor substrate is flattened by mechanical polishing is effectively eliminated by cleaning with the cathode water generated according to the foregoing method.

Upon further review of the JPA Hei 5-105991 method, we found that the effect of adding the supporting electrolyte not only reduces the water resistance but also is effective in stabilizing the pH oxidation-reduction potential.

Reduction of the amount of chemicals to be used and the recycling thereof are urgently called for, and it is also one major reason why the electrolytically activated water is being adopted in the semiconductor industry. That is, it has been proposed to activate water by utilizing electrolysis in order to eliminate the chemicals used for the semiconductor wet process or to use them as efficiently as possible. However, in order to completely replace the conventional wet process using a great amount of chemicals by the method using the electrolytically activated water, it is indispensable to improve reproducibility or reliability.

Through a further review of JPA Hei 5-105991 method, we found that, by changing the amount of the supporting electrolyte or electrolysis condition, not only pH but also the oxidation-reduction potential can be controlled. The detailed mechanism is still unknown, but it is considered to be due to the fact that the chemical condition of the added supporting electrolyte is changed and that this changed condition is stable.

Either of the foregoing conventional methods is nothing but a mere combination of the known electrolysis apparatus and a wet treatment apparatus. Therefore, they were not sufficiently reviewed from the viewpoint of achieving stably the characteristics necessary to use them in the wet treatment process, and optimization of the generating process or recycling was not taken into account. For example, in JPA Hei 5-105991, the supernatant of the waste solution is treated by means of the water cleaner and the ion exchanger to recycle as pure water. This is based on the principle in which the electrolytically activated water generating at the anode side and the electrolytic activated water generating at the cathode side are electrochemically offset and in which those two kinds of electrolytically activated water are mixed to recycle as pure water.

However, there is a limit to its recycling capability, and in order to apply it to the semiconductor wet process, it is necessary to further increase the efficiency of generating the electrolytically activated water, and a further room for further improvement is left from the viewpoint of realizing recycling.

A primary object of the present invention is to provide a method and apparatus for generating electrolytically activated water in an easy and effective manner.

A primary object of the present invention is to provide a semiconductor wet process which allows the foregoing requirements to be met.

SUMMARY OF THE INVENTION

According to the present invention, there is provided a method of generating electrolytically activated water comprising:

retaining an amount of water in an anode cell which has an anode and a cathode cell which has a cathode and separated by a partition;

applying a DC voltage between said anode and said cathode to electrolyze said water to generate electrolytically activated water; and bringing a gas containing at least one selected from the group consisting of chlorine, hydrogen chloride, hydrogen bromide and hydrogen iodide into contact with said water in said anode cell while the water is electrolyzed.

The electrolytically activated water generated from the method of the present invention can be used extremely favorably in the wet process of the semiconductor substrate.

Further, the present invention also provides an apparatus suitable for practicing the foregoing method. The apparatus comprises:

an electrolytic cell having an anode cell and a cathode cell for retaining treated water, said anode cell and said cathode cell being separated by a partition;

an anode provided in said anode cell;

a cathode provided in said cathode cell;

a power supply unit for applying DC voltage between said anode and said cathode; and means for supplying a gas containing at least one selected from the group consisting of chlorine, hydrogen chloride, hydrogen bromide and hydrogen iodide to water in said anode cell while the water is electrolyzed.

Another embodiment of the present invention comprises an apparatus for wet treatment of the semiconductor substrate which comprises:

an electrolytic cell having an anode cell and a cathode cell for retaining treated water, said anode cell and said cathode cell being separated by a partition;

an anode provided in said anode cell;

a cathode provided in said cathode cell;

a power supply unit for applying DC voltage between said anode and said cathode;

means for supplying a gas containing at least one selected from the group consisting of chlorine, hydrogen chloride, hydrogen bromide and hydrogen iodide to water in said anode cell while the water is electrolyzed;

an outlet for extracting the gas in said anode cell;

means for supplying a gas containing at least one selected from the group consisting of ammonia and nitrogen to water in said cathode cell; and an outlet for extracting the gas in said cathode cell.

The present invention further provides a wet treatment solution adapted for the semiconductor substrate in which 1 to 30% of ammonia takes the form of ammonia ion.

Still further, we provide a novel apparatus which focuses on the performance of the electrolytically activated water, and in particular, one obtained by adding a specific supporting electrolyte to water, in which case generation or recycling of the electrolytically activated water can be optimized. That is, we have realized an effective electrolysis and recycling of water by utilizing the synergetic effect by a high oxidizing potential exhibited by the oxo acid of chlorine, bromine and iodine and formation of complex ions by chlorine or the like and a high reduction potential exhibited by excessively dissociated ammonium ion. Further, we have realized efficient storage and recycling of the chemicals by supplying a supporting electrolyte in the form of gas.

BRIEF DESCRIPTION OF THE ACCOMPANYING DRAWINGS

DETAILED DESCRIPTION OF THE PREFERRED EMBODIMENTS

The present invention is hereinafter described in greater detail with reference to the accompanying drawings.

Figure 1:
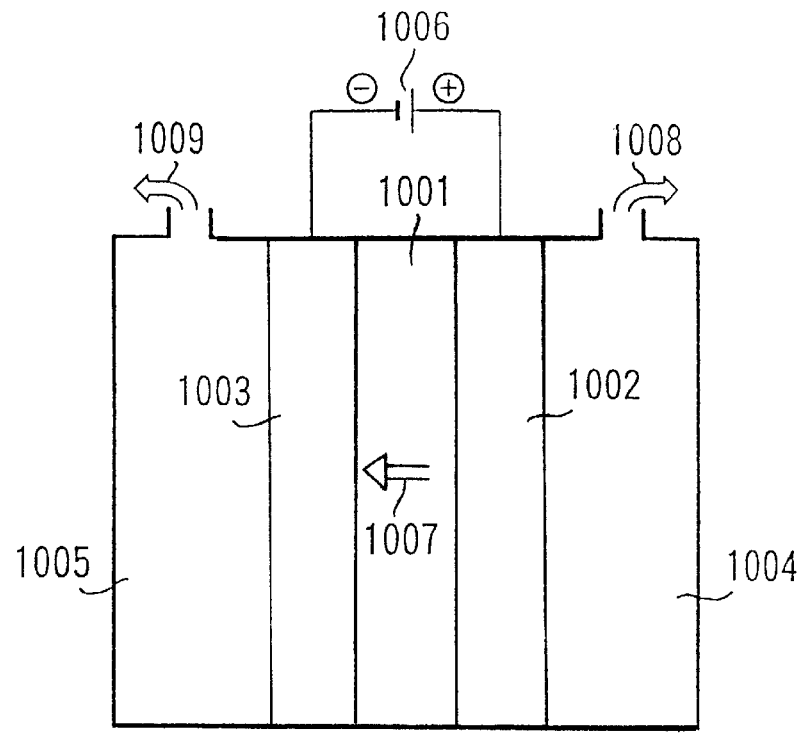
FIG. 1 is a schematic cross-sectional view illustrating a conventional water electrolyzing cell which uses a high molecular solid electrolyte.
Figure 3:
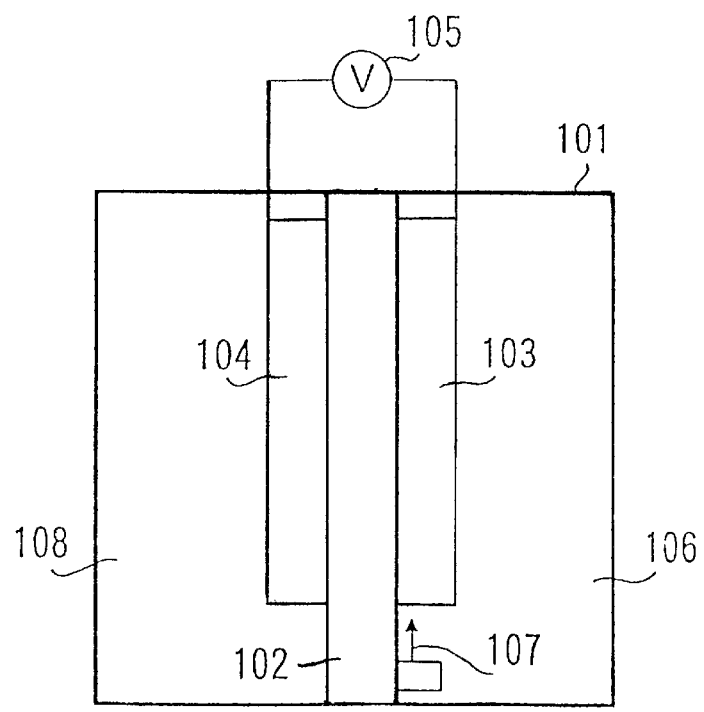
FIG. 3 is a schematic cross-sectional view illustrating a wet treatment apparatus according to the present invention which is suitable for realizing efficient generation of the electrolytically activated water.
Figure 2:
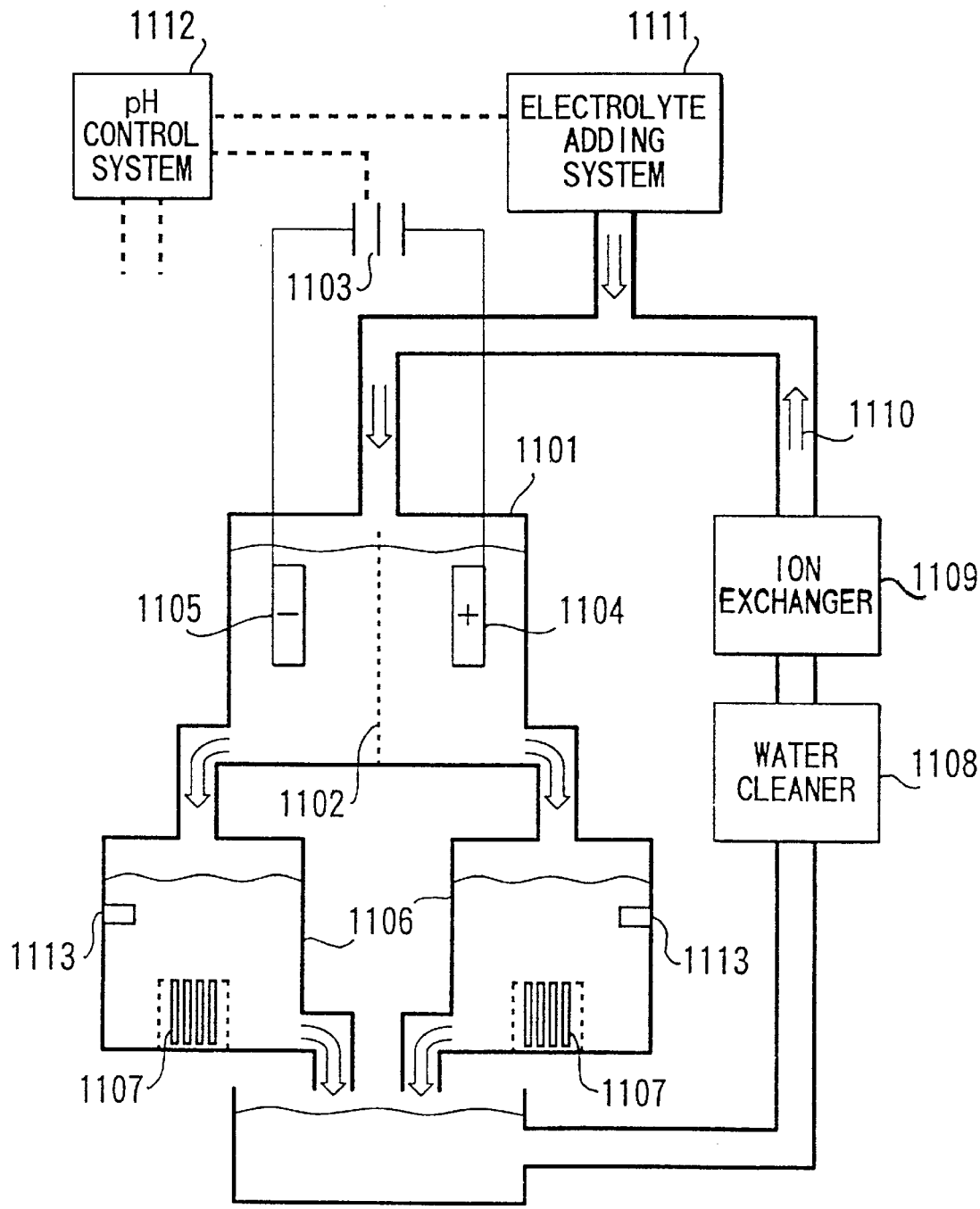
FIG. 2 is a schematic cross-sectional view of a wet treatment apparatus which is based on the conventional electrolysis.

FIG. 3 illustrates an apparatus for generating electrolytically activated water according to the present invention which is arranged so as to realize efficient generation of the electrolytically activated water. Electrolytic cell 101 is divided into an anode cell and a cathode cell by means of a partition 102 made of ion exchange resin, and an anode 103 and a cathode 104 are each disposed within each cell, to which a DC power supply 105 is connected.

As the ion exchange resin, a cation exchange resin is used, and as the anode 103 and the cathode 104, a meshed platinum electrode is used.

To the anode side, pure water or recycled water is supplied, and anode water 106 subjected to electrolytic process is produced in the wet process. For simplifying purpose, in FIG. 3, a passageway for supplying to the electrolytic cell and a passageway for delivering to the wet process is omitted.

In order to efficiently generate and stabilize the electrolytically activated water (anode water 106), a bubbler is placed below the anode 103 so that gas 107 can be supplied to the anode cell. Gas supplied to the anode cell is one containing at least one selected from among a group of chlorine gas, hydrogen chloride gas, hydrogen bromide gas and hydrogen iodide gas. Incidentally, in this embodiment, utilization of the cathode water 108, which is the electrolytically activated water at the cathode side, is not taken into account.

By using the electrolytic cell of FIG. 3, electrolysis was conducted while chlorine gas was being supplied to the anode side. A wafer of silicon whose surface was intentionally contaminated with metal to a metal concentration on the order of $10^{12}$ cm$^{-2}$, was cleaned with electrolytically activated water (anode water 106), and the effect of removing the same was examined.

Figure 4:
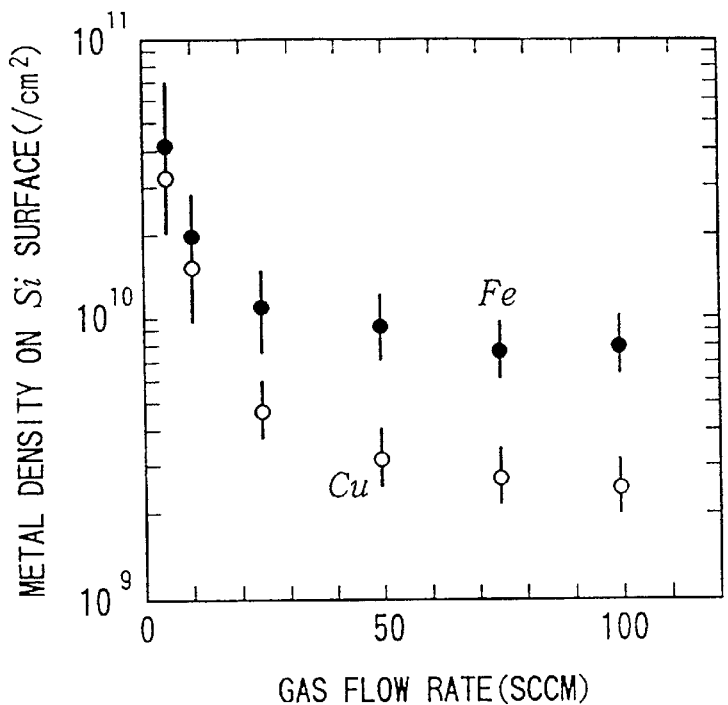
FIG. 4 is a diagram illustrating a relationship between the flow rate of chlorine gas and the effect of removing metallic contamination in a treatment conducted by using the wet treatment apparatus of FIG. 3.

FIG. 4 illustrates a relationship between the remaining amount of metal and the flow rate of the supplied chlorine gas after the wafer was cleaned with 300 mA/dm$^2$ of the current supply during electrolysis and by using electrolytically activated water generated about one liter a minute. For the oxidation-reduction potential of the electrolytically activated water, a value of about 1200 mV, at which this system is saturated, was obtained. Although ions tend to remain, if the flow rate of the chlorine gas is above 70 sccm, stable removal of metal is achieved. Incidentally, the result of FIG. 4 was obtained by using an arrangement of FIG. 3 and by supplying pure water to the electrolytic cell, and if the electrolytically activated water is recycled as shown in the following embodiment, the amount of used chlorine gas can be reduced.

When the electrolytically activated water was analyzed, even during the analysis (not immediately after the electrolysis), 40 to 50% of the chlorine which dissolved into the electrolytically activated water had existed in the form of chlorine acid ion ($ClO_3$), and the remainder had existed as the chlorine ion $Cl^-$ and chlorous acid ion ($ClO_2$). According to the table described on page 597, "Atlas of Electrochemical Equilibria in Aqueous Solutions" by Marcel Pourbaix, 1966, Pergamon Press, the theoretical value of the oxidation-reduction potential of the chloric acid ion exhibits about 1500 mV with pH=0 and about 1200 mV with pH=4. Although it is not necessarily clear by what the metal removing effect is caused, it can be considered that the metal is removed by the oxidizing power of the chloric acid ion and the formation of the complex metal ion by the chlorine ion. Even if, in place of chlorine gas, hydrogen chloride gas, hydrogen bromide gas, or hydrogen iodide gas are used, a substantially similar effect can be obtained. Incidentally, the removing effect by rinsing after the wet process is high in the order of chlorine, bromide and iodide.

If the method of the present invention and the conventional cleaning method in which a great amount of chloric acid and hydrogen peroxide water is used are compared, the present invention has several advantages other than the effect that the amount of used chemicals is greatly reduced. Chlorine gas, if pressurized at room temperature, is easy to liquefy to turn into about 45 mol per liter. Therefore, as compared with the case in which it is stored as chloric acid, the space required for storage can be reduced to less than one tenth. Further, it is said that the oxidation-reduction potential of the hydrogen peroxide per se is 710 mV even with pH=0, and it is possibly considered that products resulting from

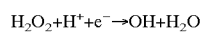

exhibit a high oxidation-reduction potential, but in order to use the hydrogen peroxide water as a stronger oxidizing agent, it is necessary to promote decomposing reaction by raising temperature. In contrast, if oxidation through chloric acid ion is utilized, then a high cleaning effect can be expected even at relatively low temperatures.

Figure 5:
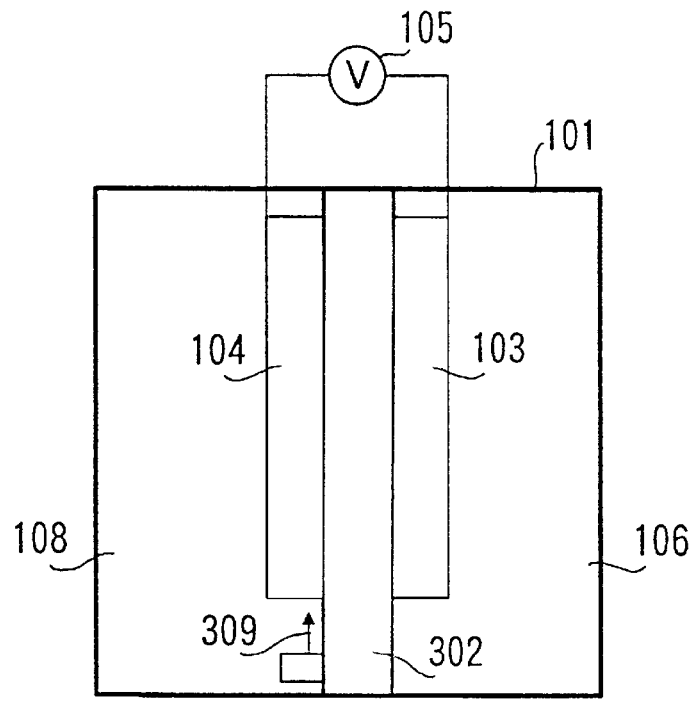
FIG. 5 is a schematic cross-sectional view illustrating a second wet treatment apparatus according to the present invention which is suitable for realizing efficient generation of the electrolytically activated water.

FIG. 5 illustrates an apparatus for generating electrolytically activated water according to a second embodiment which is suitable for realizing efficient generation of the electrolytically activated water. This apparatus has substantially the same arrangement as that of FIG. 3, but differs in that a bubbler is placed below the cathode 104 so that gas 309 can be supplied to the cathode cell. Gas 309 contains nitrogen gas or ammonia gas, and is supplied to the water within the cathode cell in order to efficiently generate and stabilize the electrolytically activated water (cathode water 108). This embodiment is arranged so that only the electrolytically activated water at the cathode side is used, and as the anode 103, a meshed platinum electrode is used, and as the cathode 104, a meshed graphite carbon is used.

Figure 6:
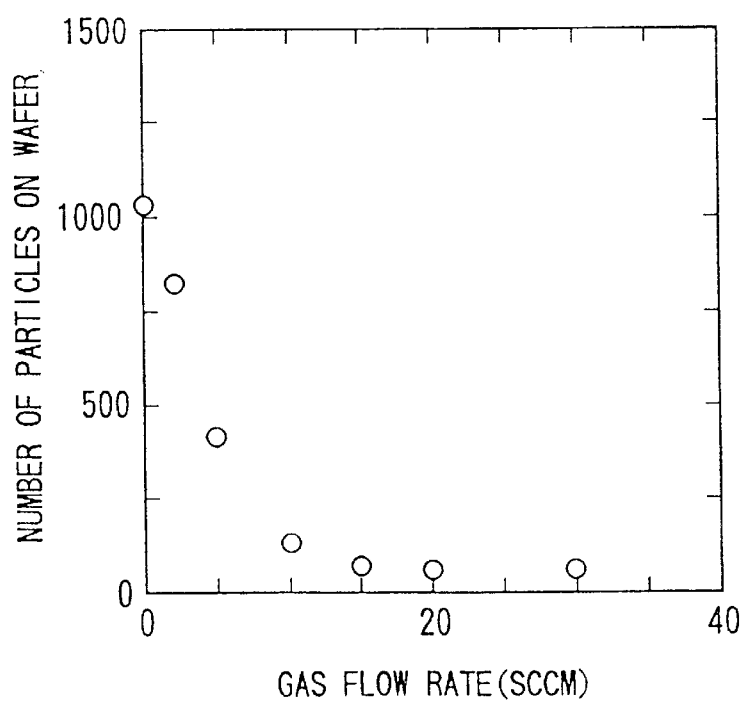
FIG. 6 is a diagram illustrating a relationship between the flow rate of ammonia gas and the effect of removing particles in a treatment conducted using the wet treatment apparatus of FIG. 5.

By the electrolytic cell shown in FIG. 5, electrolysis was conducted while supplying ammonia gas into the cathode cell. Particles were made to stick to the 6-inch silicon surface, and the removing effect was examined by the electrolytically activated water (cathode water). FIG. 6 illustrates a relationship between the flow rate of chlorine gas which is supplied to the electrolytically activated water generated at the rate of about one liter per minute and the number of particles of above 0.2 $\mu$m radius which remain on a 6-inch wafer. For cleaning, the electrolytically activated water was supplied to the cleaning cell, and was immersed for about 20 min. As evident from FIG. 6, the particle removing effect tends to approximately stabilize at above 15 sccm of the flow rate of ammonia gas. It differs from that within the anode cell in that when the same scale apparatus is used, electrolytically activated water exhibiting a constant characteristic can be obtained more efficiently, that is, in a greater amount per unit of time. Although it is necessary to increase the gas flow rate in its own way, with it, as compared with the anode water, at least about three times as much electrolytically activated water can be obtained.

As with the anode water, ions present within the cathode water supplied with 20 sccm of ammonia gas were analyzed. By electrolysis, pH is increased about 2 exhibiting about −800 mV of oxidation-reduction potential and that ammonia ion within the water is correspondingly increased. In addition, it was found that if the electrolytic treatment was not conducted, only less than 0.5% of ammonia is dissociated while within the fully electrolyzed cathode water, more than at least 10% of ammonia (the value at the time of analysis) was ionized. Since the reduction reaction is taking place at the cathode of the electrolytic cell, the electric energy supplied at the time of electrolysis is retained as the reduction potential within the aqueous solution in the form of excess ammonia ion. With pH=9, a reaction

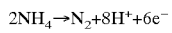

shows an oxidation-reduction potential on the order of −600 mV. In view of the fact that the value of the oxidation-reduction potential differs from the theoretical value by 200 mV, it can be conceived that although it is due to the oxidation-reduction potential, the excess ammonia ion retains the reduction potential causing the activity of water to increase. Needless to say, the amount of OH⁻ is also increased corresponding to the amount of ammonia ion and manifests itself as changing of pH.

It is not necessarily clear up to date whether the increase of the activity in the wet process is directly caused by $NH_4^+$ or $OH^-$. However, even if the increased $OH^-$ entailed improvement of the activity, it is the presence of $NH_4^+$ (stability) that makes the one or two orders of magnitude increased $OH^-$ stably present, and therefore, it is not unquestionable that the activity of this system is supported by the stability of $NH_4^+$. A certain degree of effect was obtained even using nitrogen in place of ammonia gas, but in view of the necessary gas flow rate or electric power, ammonia gas is more effective.

The ammonia ion concentration within the ammonia water which is on the order of $10^{-4}$ to $10^{-2}$ mol % was 0.3 to 0.5%. On the other hand, when an aqueous solution (ammonia water may of course be used) containing a similar range of molar concentration of ammonia was electrolyzed and the ammonia ion concentration within the electrolytically activated water which is obtained within the cathode cell was measured, it was found that by changing the electrolytic condition (for example, by increasing current density) up to about 50% of the ammonia within the solution was ionized. Since it is strictly relevant to the value at the time of measurement, it is probable that the ionizing factor immediately after electrolysis is higher.

On the other hand, when the wet process effect was analyzed, a tendency was observed that with the ionizing effect of more than about 30% at the measuring time, the particle removing effect was saturated. Apparently, the more offset there is from the equilibrium state, the lower the stability (ion concentration) is. In view of the fact that in order to increase the ionizing factor in which a corresponding amount of energy is consumed, it is considered effective to suppress the ionizing factor after the electrolysis to the order of 30%. If the electrolysis of the aqueous solution which contains ammonia is conducted, since the property of the solution is also changed other than the ionizing factor of ammonia, it is more problematic to discuss by taking only the effect of the change of the ionizing factor, but when the relationship between the wet process effect and the ionizing factor of ammonia is considered, the processing efficiency was found to increase from around a range exceeding 1% of ionizing factor. For example, use of more than about 4% of ionizing factor means that the amount of used ammonia can be set to one tenth.

Figure 7:
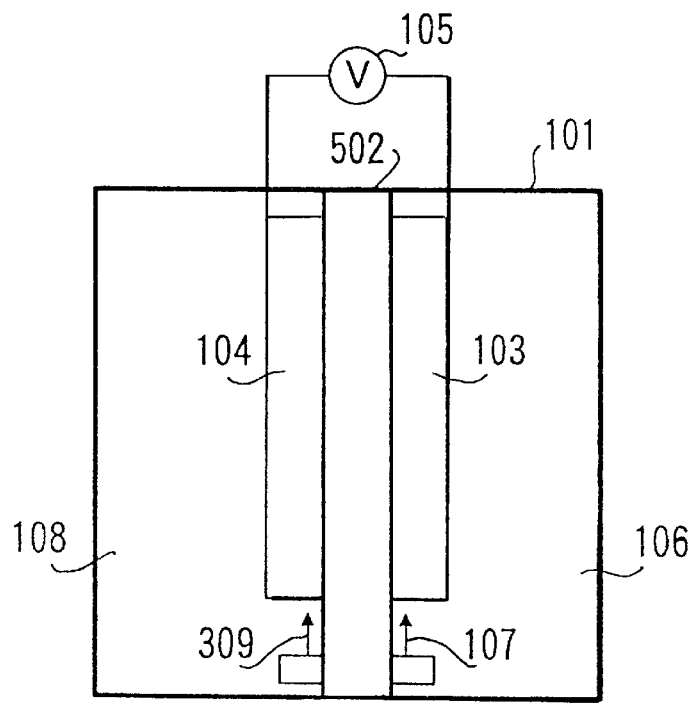
FIG. 7 is a schematic cross-sectional view illustrating a third wet treatment apparatus according to the present invention.

FIG. 7 illustrates an electrolytically activated water generating apparatus according to a third embodiment which is suitable for realizing efficient generation of the electrolytically activated water. This apparatus has a substantially similar arrangement as those of FIGS. 3 and 5, but differs from those in that a bubbler is placed below the anode 103 and the cathode 104 in order to efficiently generate and stabilize the electrolytically activated water generating at both the anode and cathode sides so that gases 107 and 309 can be each supplied to the anode cell and the cathode cell respectively. As the anode 103, a meshed platinum electrode was used, and as the cathode 104, a meshed graphite carbon was used. As the ion exchange resin 502, a fluorine based cation exchange resin was used.

This embodiment is effective when both the anode water and the cathode water are used in a single process. Although it depends on the needed characteristic of the electrolytically activated water, generally, the resulting amount of water is restricted by the characteristics of the anode water. It is considered due to the fact that the effect of generating the active species is lower on the anode side. If such an electrolytic cell is used, it is preferable to use both of the electrolytically waters obtained from the anode side and from the cathode side.

The electrolytically activated water generated using such an electrolytic cell is effective for removing metal such as iron or the like. When, as shown in FIG. 4, cleaning was conducted by using only the electrolytically activated water generating at the anode side, copper was fully removed, but the effect of removing iron was small. Therefore, by using an electrolytic cell arranged as in FIG. 7, after it was cleaned with anode water supplied with chlorine water, it was cleaned with the cathode water supplied with ammonia water. As a result, a remarkable effect is obtained in that the iron can be removed as fully as the copper.

Figure 8:
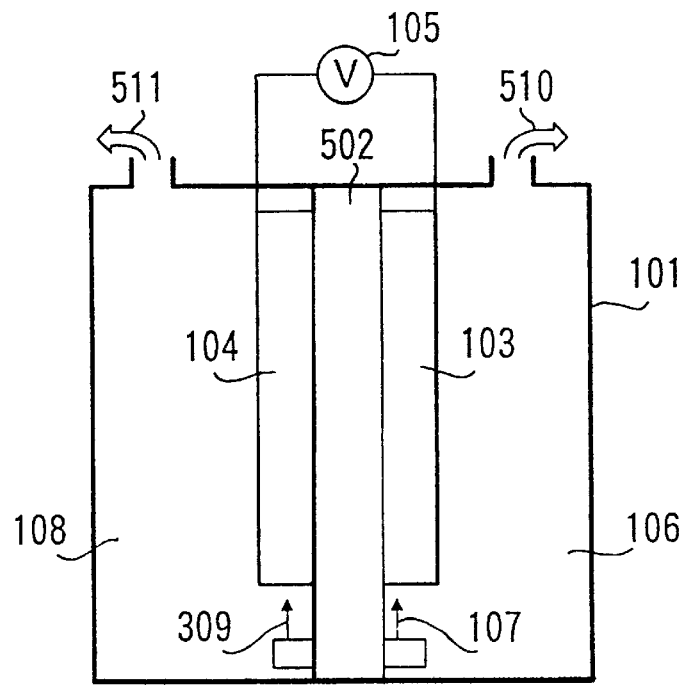
FIG. 8 is a schematic cross-sectional view illustrating a fourth wet treatment apparatus according to the present invention.

FIG. 8 illustrates an electrolytically active generating apparatus according to a fourth embodiment which is suitable for realizing efficient generation of the electrolytically activated water. This apparatus has a substantially similar arrangement as that of FIG. 7, and differs from that in that an outlet for extracting gas 510 generating at the anode cell and an outlet for extracting gas 511 generating at the cathode cell are provided. Such an arrangement displays a remarkable effect when the gas pressure at the electrolytic portion is controlled, and when it is desired to efficiently neutilize the generating gas (including the supplied gas). Also, in an arrangement using either one of the anode water and cathode water, oxygen gas (chlorine gas, as necessary) is generated at the anode side, and hydrogen gas is generated at the cathode side. Hence, considering efficient utilization of such gas will not only increase generating efficiency of the electrolytically activated water, but also desirably increase the safety degree in the sense that the danger of the generating gas being mixed is eliminated.

Figure 9:
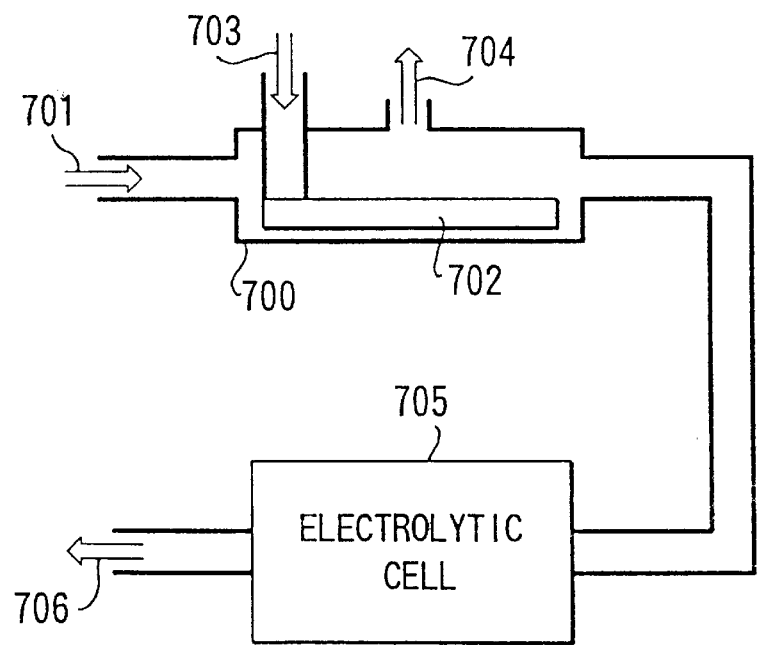
FIG. 9 is a schematic cross-sectional view illustrating a fifth wet treatment apparatus according to the present invention.

FIG. 9 illustrates schematically an electrolytically activated water generating apparatus according to the present invention which is suitable for realizing efficient generation of the electrolytically activated water. With the apparatuses shown in FIGS. 3, 5 and 7, gases are supplied in the anode cell and/or the cathode cell. However, such an arrangement is not always necessary, since, as in FIG. 9, pure water or regenerated water 701 which is supplied to the anode cell and/or the cathode cell can be passed within a container 700 through the bubbler 702 to bring into contact with gas 703 to dissolve gas into water before it is supplied to the electrolytic cell 705. In order to effectively utilize dissolved gas, it is desirable to provide a gas recovery hole 704 as in FIG. 8.

In the electrolytic cell 705, the electrolytic process is conducted, and the resulting electrolytically activated water 706 is utilized for the wet process of the semiconductor. According to the result of researching the relationship between the amount of generating electrolytically activated water generating within the anode cell and the gas flow rate, in such an arrangement, a gas flow rate about 30% as great as that for the arrangement of FIG. 3 was needed. Further, in the cathode cell, the increase of necessary gas flow rate was found to be about ten percent.

As already explained with reference to FIG. 4, these data are strictly the result of supplying gas to the pure water, but in a system incorporating a recycling system shown later, it is possible to leave the dissolved gas within the recycled water, and by utilizing such recycled water, it is possible to reduce the amount of newly added gas. When appropriate recycled water was used, it was demonstrated that the total amount of necessary gas does not practically differ from that for the case in which gas was previously dissolved.

Figure 10:
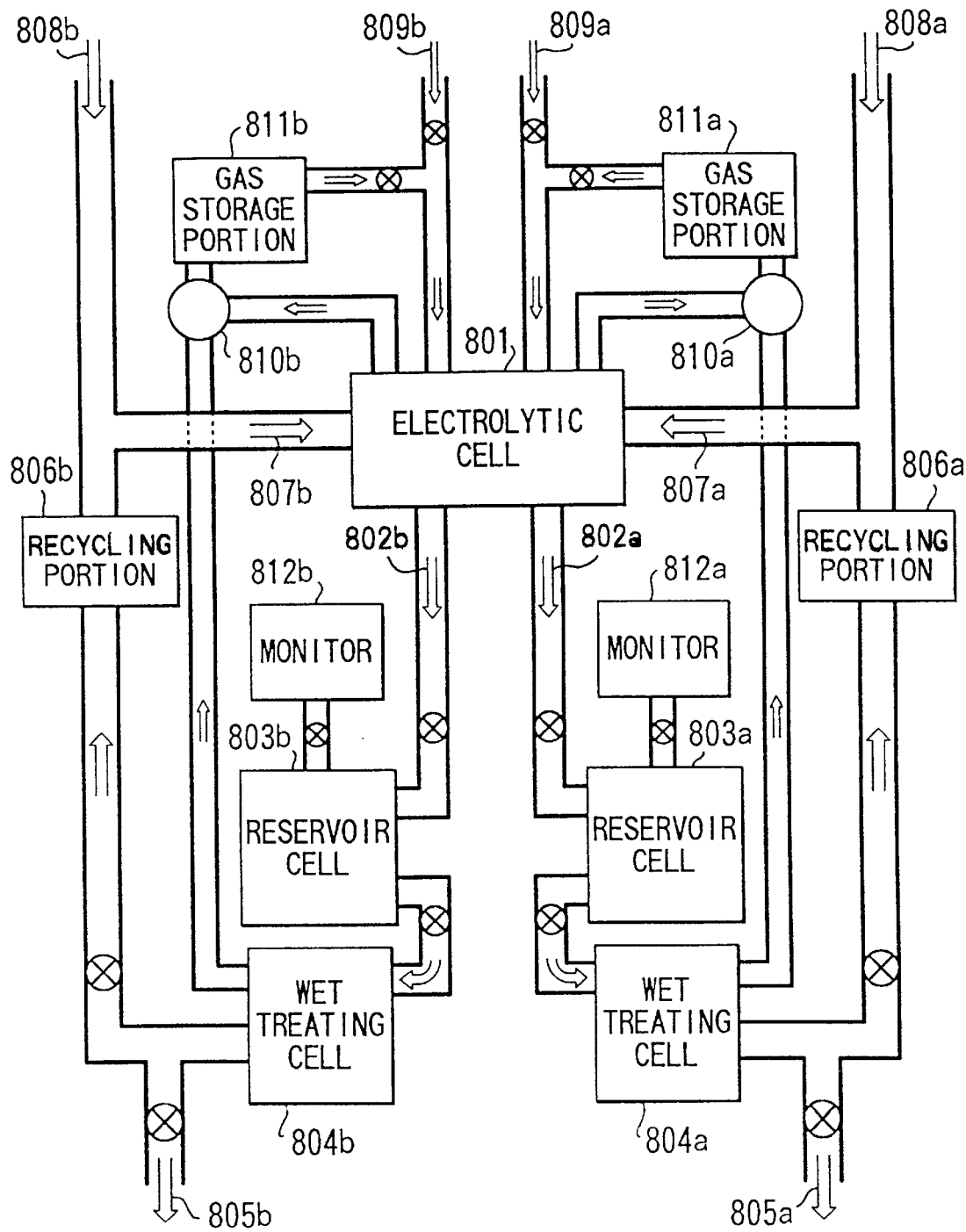
FIG. 10 is a schematic layout view illustrating a sixth wet treatment apparatus according to the present invention.

FIG. 10 illustrates schematically the arrangement of the wet process apparatus according to the present invention. This apparatus is arranged so as to use both the anode water an the cathode water in a single process, and as the electrolytic cell 801, the same one as those of FIG. 7 or 8 is used. At the anode side of the electrolytic cell 801, electrolytically activated water (anode water) 802a generating within the anode cell is retained in the reservoir cell 803a, and is supplied to the wet process cell 804a, as necessary, to be used for wet treatment of the semiconductor substrate.

If the contamination of the electrolytically activated water after undergoing the wet process is high, then it is delivered to the outside of the system as waste solution 805a and, on the other hand, otherwise, is sent to a recycling portion 806a by the action of a pump (not shown); where, after being recycled, it is returned to the anode cell of the electrolytic cell 801.

Further, chlorine gas and generated oxygen gas (and ozone) which are recovered within the wet process cell 804a and the anode cell of the electrolytic cell 801, after being compressed by a pump 810a, is retained in gas storage portion 811a to be recycled into the anode cell of the electrolytic cell 801, as necessary.

On the other hand, at the cathode side, electrolytically activated water (cathode water) 802(b) generated within the cathode cell is retained in the reservoir cell 803b and is supplied to the wet process cell 804b, as necessary, to be used for wet process of the semiconductor substrate.

If the contamination of the electrolytically activated water after passing through the wet process is high, then it is delivered to the outside as waste solution 805b and, otherwise, is sent to the recycling portion 806b under the action of a pump (not shown) where, after being recycled, it is returned to the cathode cell of the electrolytic cell 801 as recycled water 807b.

Ammonia gas or generated hydrogen gas which are recovered at the wet process cell 804a through the anode portion of the electrolytic cell 801, after being compressed by the pump 810b, is retained in the gas storage portion 811b, and is supplied to the electrolytic cell 801, as necessary. Gas supply to the electrolytic cell 801 is controlled by a computer based on the signals from monitoring system 812a or 812b provided at the reservoir cell 803a or 803b. Incidentally, the computer and the signal path are not shown.

Considering that the cathode water whose activity is degraded after the wet process consists mainly of ammonium hydroxide, it is desirable to combine both positive and negative particle removing ion exchange resins in the recycling portion 806b. By supplying the recycled water 807b passing through such recycling portion 806b to the cathode side, it is possible to realize effective generation of the electrolytically activated water and recycling of the same. In place of the waste water, pure water 808a or 809b is replenished to the electrolytic cell 801, and chlorine gas 809a is supplied to the anode side of the electrolytic cell 801, and ammonia gas 809b supplied to the cathode side of the same.

When chlorine gas or the like was supplied to the anode cell to stably increase the activity of the electrolytically activated water generating within the anode cell, it was optimal for stabilization of the activity of the electrolytically activated water supplied to the wet process to dilute the electrolytically activated water of the reservoir 803a to about 100 times to monitor the oxidation-reduction potential of the same supplied to the wet process. When ammonia gas was supplied to the cathode side to stably increase the activity of the electrolytically activated water generating within the cathode cell, it was optimal to monitor pH of the same within the reservoir 803b.

Waste solutions 805a and 805b are mixed and neutralized for final treatment, but since unlike ordinary cleaning solutions, the ionicity of the anode water and cathode water are canceled, the cost of processing the water solutions is remarkably reduced. Since the anode water consists mainly of chlorine ion with a trace of chloric acid ion mixed thereto, it is desirable to combine the particle removing portion and the negative ion exchange resin for the recycling portion 806a. By supplying the recycled water 807a passing through such recycling portion 806a to the anode side, it is possible to realize efficient generation and recycling of the electrolytically activated water.

Figure 11:
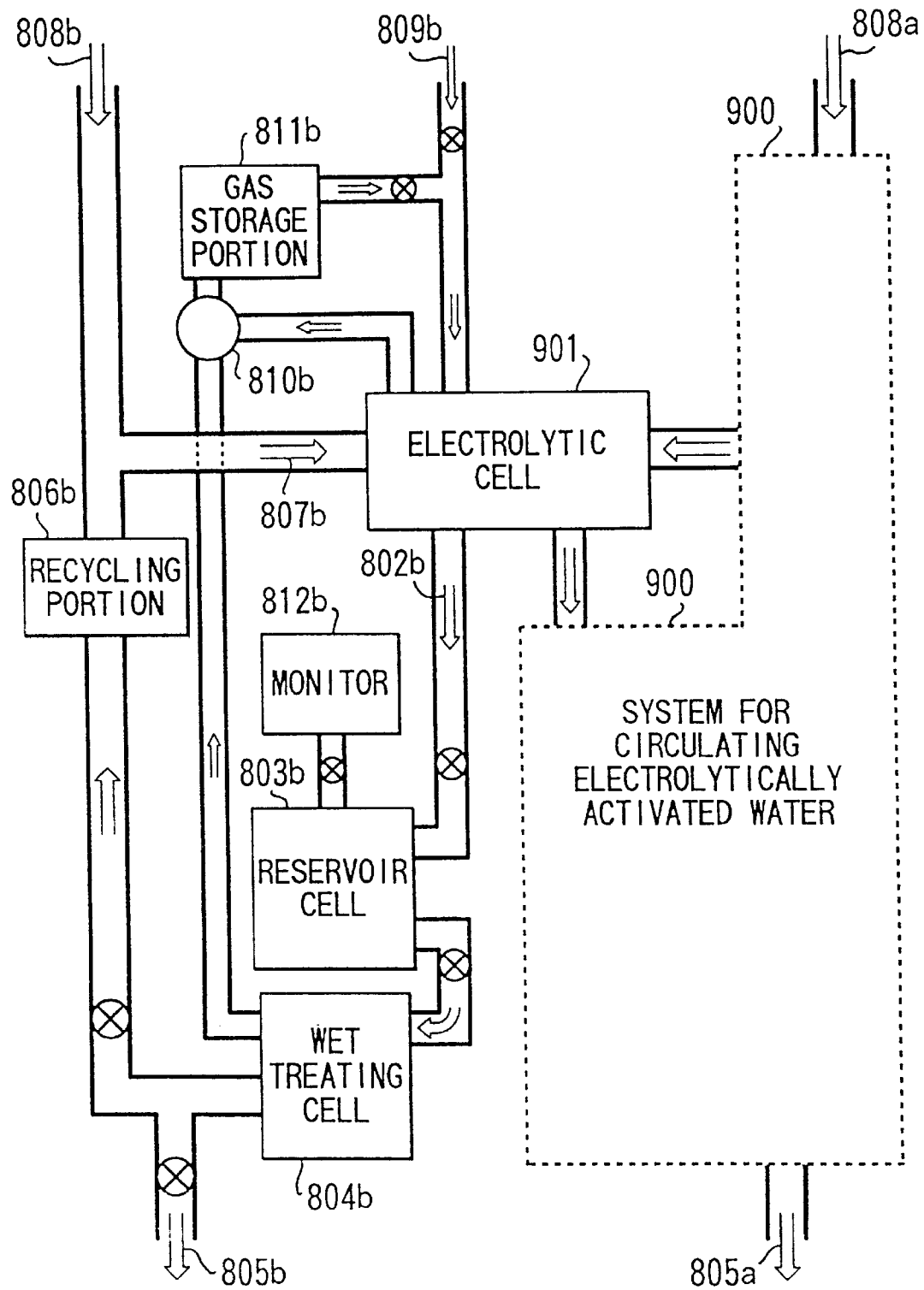
FIG. 11 is a schematic cross-sectional view illustrating a seventh wet treatment apparatus according to the present invention which is suitable for realizing recycling of the electrolytically activated water.

FIG. 11 illustrates a schematic arrangement of the wet process apparatus according to the present invention which is optimal in utilizing only the electrolytically activated water generating at the cathode side. Although the arrangement of the cathode side is the same as that of FIG. 10, the anode side is arranged so as to merely circulate the electrolytically activated water (900), and the waste solution 805a is utilized to neutralize it with the waste solution 805b. In this case, as the electrolytic cell 901, the arrangement of FIG. 5 is suitable. Also if only the electrolytically activated water at the anode side is utilized, the anode side and the cathode side of FIG. 11 may be replaced with each other.

What is claimed is:

1. An apparatus for generating electrolytically activated water comprising:

an electrolytic cell having an anode cell and a cathode cell for retaining treated water, said anode cell and said cathode cell being separated by a partition comprised of ion exchange resin; an anode provided in said anode cell;

a cathode provided in said cathode cell;

a power supply unit for applying DC voltage between said anode and said cathode;

bubbler means positioned in said anode cell, but independent from said anode, and operatively associated with a source of gas containing at least one member selected from the group consisting of chlorine, hydrogen chloride, hydrogen bromide and hydrogen iodide to water for supplying said gas in said anode cell while the water is electrolyzed; and means for retaining said gas in said anode cell during electrolysis.

2. An apparatus for wet treating a semiconductor substrate comprising:

an electrolytic cell having an anode cell and a cathode cell for retaining treated water, said anode cell and said cathode cell being separated by a partition comprised of ion exchange resin;

an anode provided in said anode cell;

a cathode provided in said cathode cell;

a power supply unit for applying DC voltage between said anode and said cathode;

bubbler means positioned in said cathode cell, but independent from said cathode, and operatively associated to a source of gas containing at least one member selected from the group consisting of ammonia and nitrogen for supplying said gas to water in said cathode cell; and means for retaining said gas in said cathode cell during electrolysis.

3. An apparatus for wet treating a semiconductor substrate comprising:

an electrolytic cell having an anode cell and a cathode cell for retaining treated water, said anode cell and said cathode cell being separated by a partition comprised of ion exchange resin;

an anode provided in said anode cell;

a cathode provided in said cathode cell;

a power supply unit for applying DC voltage between said anode and said cathode; and bubbler means positioned in said anode cell, but independent from said anode, and operatively associated with a source of gas containing at least one member selected from the group consisting of chlorine, hydrogen chloride, hydrogen bromide and hydrogen iodide for dissolving said gas into treated water supplied to said anode cell; and means for retaining said gas in said anode cell during electrolysis of said water.

4. An apparatus for wet treating a semiconductor substrate comprising:

an electrolytic cell having an anode cell and a cathode cell for retaining treated water, said anode cell and said cathode cell being separated by a partition comprised of ion exchange resin;

an anode provided in said anode cell;

a cathode cell provided in said cathode cell;

a power supply unit for applying DC voltage between said anode and said cathode;

bubbler means positioned in said cathode cell, but independent from said cathode, and operatively associated with a source of gas containing at least one member selected from the group consisting of ammonia and nitrogen for dissolving said gas into treated water supplied to said cathode cell; and means for retaining said gas in said cathode cell during electrolysis of said water.

* * * * *